United States Patent
Bhatia et al.

(10) Patent No.: US 6,269,208 B1
(45) Date of Patent: *Jul. 31, 2001

(54) WAVELENGTH TUNING OF PHOTO-INDUCED GRATINGS

(75) Inventors: Vikram Bhatia, Painted Post, NY (US); Robert A. Modavis, Santa Rosa, CA (US)

(73) Assignee: Corning Incorporated, Corning, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/417,818

(22) Filed: Oct. 14, 1999

Related U.S. Application Data

(60) Provisional application No. 60/106,512, filed on Oct. 30, 1998.

(51) Int. Cl.[7] .............................. G02B 6/34; G02B 27/00
(52) U.S. Cl. .......................... 385/37; 359/559; 359/566; 359/570; 359/577; 359/900
(58) Field of Search .......................... 385/37; 359/577, 359/575, 572, 570, 566, 35, 34, 8, 900, 558, 559

(56) References Cited

U.S. PATENT DOCUMENTS

| | | | |
|---|---|---|---|
| 4,140,362 | * 2/1979 | Tien | 359/566 |
| 5,016,951 | * 5/1991 | Deason et al. | 430/1 |
| 5,058,977 | * 10/1991 | Sorin | 385/37 |
| 5,327,515 | 7/1994 | Anderson et al. | 385/123 |
| 5,331,466 | * 7/1994 | Van Saarloos | 359/723 |
| 5,367,588 | * 11/1994 | Hill et al. | 385/37 |
| 5,400,422 | * 3/1995 | Askins et al. | 385/37 |
| 5,552,882 | * 9/1996 | Lyons et al. | 359/35 |
| 5,574,810 | * 11/1996 | Byron et al. | 385/37 |
| 5,619,603 | * 4/1997 | Epworth et al. | 385/37 |
| 5,652,818 | * 7/1997 | Byron | 385/37 |
| 5,655,040 | * 8/1997 | Chesnoy et al. | 385/37 |
| 5,748,814 | * 5/1998 | Painchaud et al. | 385/37 |
| 5,822,479 | * 10/1998 | Napier et al. | 385/37 |
| 5,837,169 | * 11/1998 | Rourke | 385/10 |
| 5,953,472 | * 9/1999 | Boschis et al. | 385/37 |
| 6,178,045 | * 1/2001 | Cook et al. | 359/559 |

FOREIGN PATENT DOCUMENTS

| | | | |
|---|---|---|---|
| 0682272A2 | * 11/1995 | (EP) . | |
| 2289770 | * 11/1995 | (GB) . | |
| 0074902 | * 3/1990 | (JP) | 359/572 |
| 001697040 | * 12/1991 | (RU) | 359/566 |

OTHER PUBLICATIONS

S.K. Yao, et al., "Chirp–Grating Lens for Guided–Wave Optics", Appl. Phys. Lett., vol. 33, No. 7, pp 635–637, Oct. 1978.*

A.C. Livanos, et al., "Fabrication of Grating Structures with Variable Period", Optics Comm., vol. 20, No. 1, pp. 179–182, Oct. 1978.*

Prohaska et al., *Magnification Of Mask Fabricated Fibre Bragg Gratings*, Electronics Letters, vol. 29, No. 18, 2nd Sep. 1993 pp. 1614–1615.

Zhang et al., *Tuning Bragg Wavelength by Writing Gratings on Prestrained Fibers*, IEEE Photonics Technology Letters, vol. 6, No. 7, Jul. 1994 pp 839–841.

Quin Zhang et al., "Tuning Bragg Wavelength by Writing Gratings on Prestrained Fibers", Jul. 1994, Photonics Technology Letters, vol. 6, No. 7 pp. 839–841.

* cited by examiner

*Primary Examiner*—Cassandra Spyrou
*Assistant Examiner*—John Juba, Jr.
(74) *Attorney, Agent, or Firm*—Svetlana Short; Mary Y. Redman

(57) ABSTRACT

Optical gratings having a range of possible Bragg wavelengths can be produced using a single phase mask by exposing the mask to a non-collimated spatially filtered beam of light. A spatial filter removes high spatial frequency components from the beam, and a focusing system directs the filtered beam to a phase mask. A rate at which the beam is focused and a spacing between the phase mask and a photo-sensitive waveguide are varied to produce gratings in the waveguide having a range of possible periods.

31 Claims, 4 Drawing Sheets

WAVELENGTH TUNING OF PHOTO-INDUCED GRATINGS

RELATED APPLICATIONS

This application claims the benefit of U.S. Provisional Application, Ser. No. 06/106,512, filed Oct. 30, 1998 entitled WAVELENGTH TUNING PHOTO-INDUCED GRATINGS, which is hereby incorporated by reference.

TECHNICAL FIELD

The invention relates to optical gratings manufactured in photosensitive media of optical waveguides by patterned exposures to actinic radiation. The patterns which include alternating bands of light are generally produced by interference fringes and can have periods of less than one micron.

BACKGROUND

Interference patterns for making optical waveguide gratings, particularly fiber Bragg gratings, can be produced using an interferometer or a phase mask. Interferometers divide a coherent beam of light into two separate beams that are angularly recombined at the waveguides for producing a desired interference pattern. Phase masks, which are themselves diffraction gratings, divide a similarly coherent beam into different diffraction orders that are recombined at the waveguides for producing a similar interference pattern.

For purposes of manufacturing, phase masks are often preferred because interferometers can be less stable and difficult to use in production environments. Phase masks are more stable but have less flexibility for adjusting the period of their resulting interference patterns. The interference period between two collimated beams is a function of the wavelength of the interfering beams and the angle at which the beams are combined. Any change in the wavelength of a beam divided by a phase mask also changes the diffraction angles through which the divided beams are recombined, so a different phase mask is often needed for each desired interference pattern.

A few techniques have been developed to adjust the effect of photoinduced waveguide patterns produced by phase masks. Bragg wavelengths (center wavelengths) of the resulting grating responses are a function of both the grating period and the average refractive index of the waveguides. Small adjustments to the Bragg wavelength have been made by pre-straining waveguides (i.e., optical fibers) and by illuminating phase masks with converging or diverging beams.

The former technique is described in a paper entitled "Tuning Bragg Wavelength by Writing Gratings on Pre-strained Fibers" by Quin Zhang et al., published in Photonics Technology Letters, Vol., 6, No. 7, July 1994. A photosensitive fiber is exposed to an interference pattern produced by a phase mask while under strain. When the strain is relieved, the Bragg wavelength is down-shifted with respect to a similarly exposed unstrained fiber. Only a limited amount of strain can be tolerated by fibers and other waveguides, so the amount of adjustment by this technique is limited.

A paper entitled "Magnification of Mask Fabricated Fibre Bragg Gratings" by J. D. Prohaska et al., published in Electronics Letters, Vol. 29, No. 18, Sep. 2, 1993, proposes to illuminate phase masks with converging or diverging beams to adjust the magnification of interference patterns incident to photosensitive fibers. The power of a converging or diverging lens, the distance between the lens and the phase mask, and the distance between the phase mask and fiber can be changed to adjust the magnification of the interference pattern within the Fresnel near field of the light passing through the phase mask. However, only small changes in periodicity are practical because interference patterns produced at a distance from the phase mask are limited by spatial coherence of the illuminating beam.

U.S. Pat. No. 5,327,515 to Anderson et al. mounts a lens between a phase mask and a photosensitive fiber to project an image of a interference pattern formed at the phase mask onto the fiber. The lens projection system can be arranged to provide magnification or reduction of the interference pattern projected onto the fiber. However, like the known interferometer arrangements, issues of stability and alignment render this technique less practical in a production environment.

SUMMARY OF INVENTION

Our invention provides more flexibility in the manufacture of optical waveguide gratings with phase masks. Adjustments can be made in grating period and grating length, as well as apodization profiles. Small changes can be made to the gratings for purposes of tuning to compensate for other design variations, or large changes can be made to manufacture gratings with different specifications. One grating can be written over another with the same phase mask, which is particularly useful for making compound sensors. Grating chirp can also be controlled to support more complex spectral responses.

Our preferred embodiment includes a spatial filter that removes spatially incoherent light from a beam of light (i.e., actinic radiation). A phase mask divides the filtered beam of light into two interfering beams that form an interference pattern with an average fringe period along a waveguide. A focusing system directs the beam of light approaching the spatial filter as a converging beam and further directs the filtered beam of light as a noncollimated beam impinging upon the phase mask. A waveguide support positions the waveguide at a distance from the phase mask to adjust the average fringe period of the interference pattern formed along the waveguide.

The spatial filter filters incoherent light from at least a first of two orthogonal directions transverse to an axis of beam propagation. This is the same direction in which the waveguide is oriented. The focusing system converges the beam of light in the first orthogonal direction through a first focal line located at the spatial filter. Approaching the waveguide, the focusing system diverges or converges the filtered beam in the first orthogonal direction. By locating a diverging or converging element between the spatial filter and the phase mask, the effective center of curvature of the beam impinging on the phase mask can be varied. A diverging beam impinging on the phase mask in the first orthogonal direction increases the average fringe period formed along the waveguide, and a converging beam impinging on the phase mask in the same first orthogonal direction decreases the average fringe period. To minimize optical components requiring alignment, the diverging beam can have a center of curvature on the first focal line, which is located at the spatial filter.

The focusing system preferably provides separate control over beam shape in the two orthogonal directions. In the first direction, which is filtered to enhance spatial coherence, the beam is shaped to influence the magnitude of a change in the fringe period associated with a given spacing between the phase mask and waveguide. In the second direction, a separate focusing optic can be used to concentrate light energy on the waveguide. For example, the filtering system can be arranged to diverge the filtered beam along the first orthogonal direction approaching the phase mask for increasing the average fringe period and to converge the same beam along the second orthogonal direction approaching the phase mask for concentrating more light energy on the waveguide.

The spatial filter permits the phase mask and the waveguide to be separated through larger distances while still producing an interference pattern with good fringe contrast. A similar fringe period can be obtained at more than one distance between the phase mask and the waveguide by adjusting the rate of convergence or divergence of the filtered beam. Other variables affected by the distance separating the phase mask and the waveguide include the length of overlap between interfering beams emerging from the phase mask and the intensity profile of the recombined beams. The length of overlap controls the length of grating written into the waveguide. The intensity profile affects apodization issues for obtaining the desired spectral response.

The waveguide can also be tilted in an axial plane that includes the first orthogonal direction for producing a linear chirp in the grating, evident as a grating period that varies from one end of the grating to the other. Shorter focal lengths of the diverging or converging beam upon the phase mask (e.g., a shorter distance between the first focal line at the spatial filter and the phase mask) can produce a quadratic chirp in the grating, evident as a grating period that varies as a function of distance from the center of the grating. Such quadratic chirp can also influence apodization issues.

DRAWINGS

DETAILED DESCRIPTION

Figure 1:
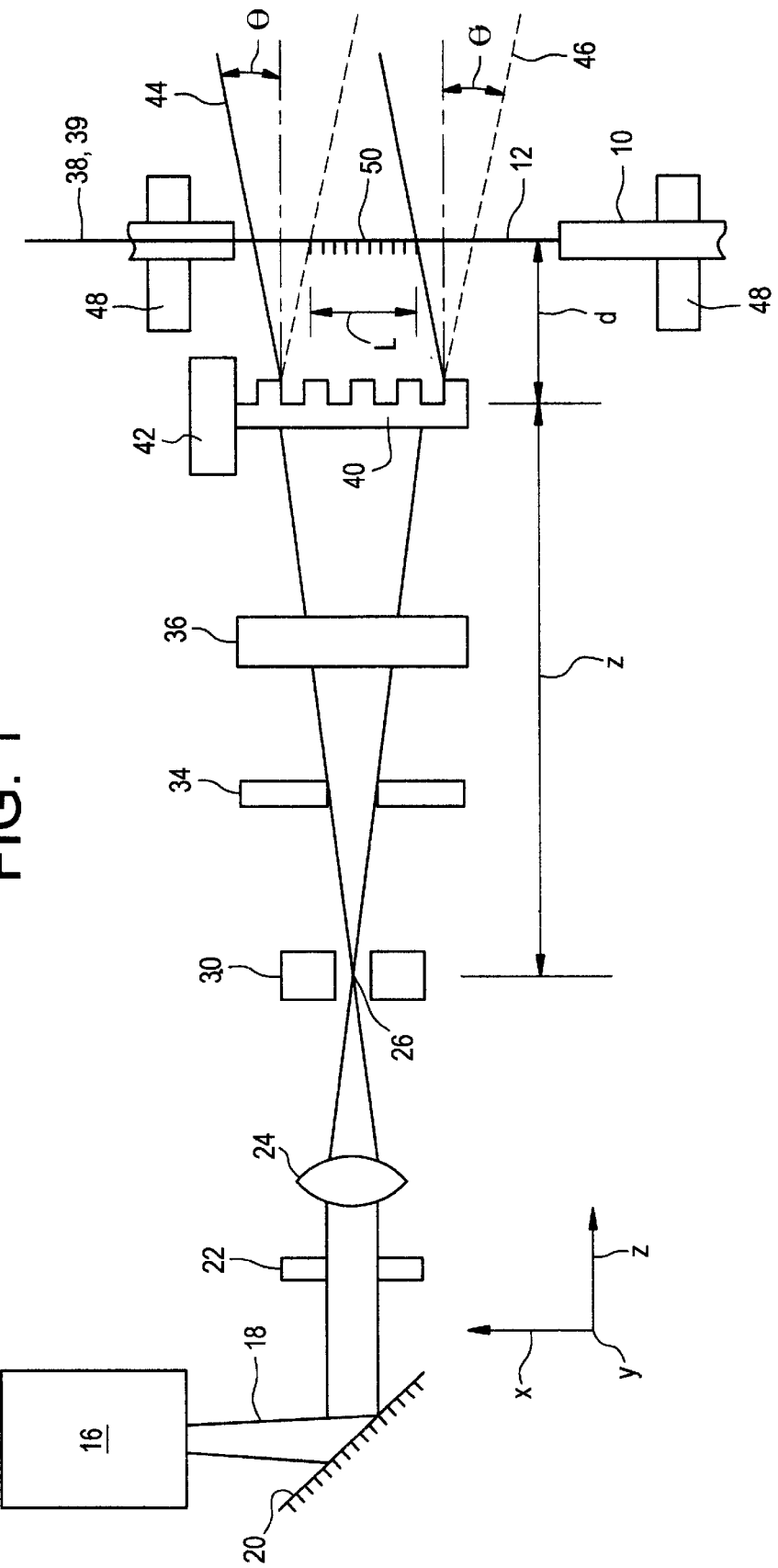
FIG. 1 is a diagram of apparatus for photo-inducing a grating in a waveguide using a phase mask.

The arrangement 10 shown in FIG. 1 can be used for forming an optical grating in a waveguide 12, which is shown as an optical fiber, but can also be configured in other forms including planar or channel waveguides. The waveguide 12 has an exposed portion 14 that includes a photosensitive core surrounded by a cladding. An exemplary photosensitive core is made from a combination of silica and germanium, while the cladding can be composed of silica alone. Hydrogen loading can be used to enhance photosensitivity.

A laser source 16, such as an excimer laser operating in a wavelength range between 150 and 250 nm, produces a beam 18 of actinic, temporally coherent radiation. Other lasers and other wavelengths can also be used in combination with material sensitive to the alternative wavelengths and power regimes. Pulsed or continuous wave radiation can be used.

Following a turning mirror 20, a first aperture stop 22 strips extraneous portions from the beam 18 in advance of a first focusing lens 24 (e.g., a cylindrical lens) that converges the beam through a first line focus 26. Referenced with respect to an orthogonal coordinate system in which a coordinate "Z" extends in the direction of beam propagation and coordinates "X" and "Y" extend in a plane transverse to the direction of beam propagation, the convergence of the beam 18 through the line focus 26 takes place in the "X" coordinate direction. The line focus 26 extends in the "Y" coordinate direction, which is normal to the drawing plane of FIG. 1.

A spatial filter 30 in the vicinity of the line focus 26 diverts high spatial frequency components of the beam 18 for enhancing the beam's spatial coherency. Details of our preferred spatial filter 30 are disclosed in U.S. Provisional Application No. 60/047,859 entitled "Spatial Filter for High Power Laser Beam", which is hereby incorporated by reference. Leaving the spatial filter 30, the beam 18 has a $\text{sinc}^2$ intensity profile, which is stripped of side lobes by a second aperture stop 34. A second focusing lens 36 (e.g., another cylindrical lens) converges the beam 18 in the "Y" coordinate direction through a second line focus 38 approximately coincident with an axis 39 of the waveguide 10. Both the line focus 38 and the axis 39 of the waveguide 10 extend in the "X" orthogonal direction.

In contrast to the focused convergence in the "Y" coordinate direction, the beam 18 continues to diverge in the "X" coordinate direction through the focusing lens 36 until the beam 18 strikes a phase mask 40 at angles of incidence that vary as a function of distance from a center of the beam 18. A total divergence of the beam 18 from the first focal line 26 to the phase mask 40 takes place through a distance "z". An adjustable mount 42 for the phase mask 40 translates in the "Z" coordinate direction to adjust the distance "z". The phase mask 40, which is itself a diffraction grating, diffracts the beam 18 into two interfering beams 44 and 46 through two different preferably opposite sign diffraction orders (e.g., +1 and −1 orders). Other combinations of orders can also be used including a combination of zero and first orders, but the two first orders are preferred.

Instead of positioning the phase mask 40 directly against the exposed portion 12 of the waveguide 10 in accordance with usual practices, the phase mask 40 is spaced apart from the exposed portion 12 through a distance "d" along the "Z" coordinate axis. The waveguide 10 is supported on an adjustable mount 48 that is translatable in the "Z" coordinate direction for varying the distance "d" between the phase mask 40 and the waveguide 10 independently of the distance "z" between the line focus 26 and the phase mask 40. Given the enhanced spatial coherence of the beam 18, distances "d" of one centimeter or more are possible, which provide significant additional control over pitch spacing of the resulting fringe pattern on the waveguide 10 as well as the corresponding Bragg wavelength of the resulting optical grating 50 formed in the exposed portion 12 of the waveguide 10. Also, positioning the waveguide out of contact with the phase mask avoids unnecessary interactions that can affect quality and consistency of results.

A change in the Bragg wavelength "$\Delta\lambda_B$" as a function of the variables "z" and "b" is given by the following equation:

$$\Delta\lambda_B = (n_{eff}\lambda_{write}/\sin\theta)\{[1+(d/z)^2+2(d/z)\cos\theta]^{1/2}-1\}$$

where "$\lambda_{write}$" is the wavelength of the illuminating beam 18, "$n_{eff}$" is the effective average index of the core of the waveguide 10, and "θ" is the half angle between the opposite sign orders of the interfering beams 44 and 46.

The above equation can be approximated for many practical purposes where "z" is much larger than "d" as follows:

$$\Delta\lambda_B = n_{eff}\lambda_{write}(d/z)\cot\theta$$

From the equation just above, it is apparent that decreasing "z" or increasing "d" increases the change in the Bragg wavelength of the grating. The distance "z", which is related to the divergence rate of the beam 18 in the "X" coordinate direction, controls the rate at which changing the distance "d" affects the amount of overlap between the interfering beams 44 and 46 as well as the combined intensity profile of the interfering beams 44 and 46. The amount of overlap controls the length of grating that is written into the waveguide 10. Increasing spacing between peak intensity profiles of the interfering beams 44 and 46 can be used to reduce intensity variations within the range of overlap to provide better control over the resulting spectral response of the optical grating 50. A further explanation of the apodization effects of spacing the waveguide 10 at a distance "d" from the phase mask 40 is provided in U.S. Provisional Application No. 60/091,547 filed on Jul. 1, 1998 with the title of "Apodization of Optical Filters Formed in Photosensitive Media", and this application is hereby incorporated by reference.

For example, changes to the Bragg wavelength of the optical grating 50 can be made in combination with control over the length of grating 50 and the combined intensity profile of the interfering beams 44 and 46 by exploiting various combinations of the distances "z" and "d". Shorter distances "z" can also be used to provide the grating 50 with a quadratic chirp, namely, a progressive variation of the grating pitch as a function of distance from the center of the grating.

Figure 2:
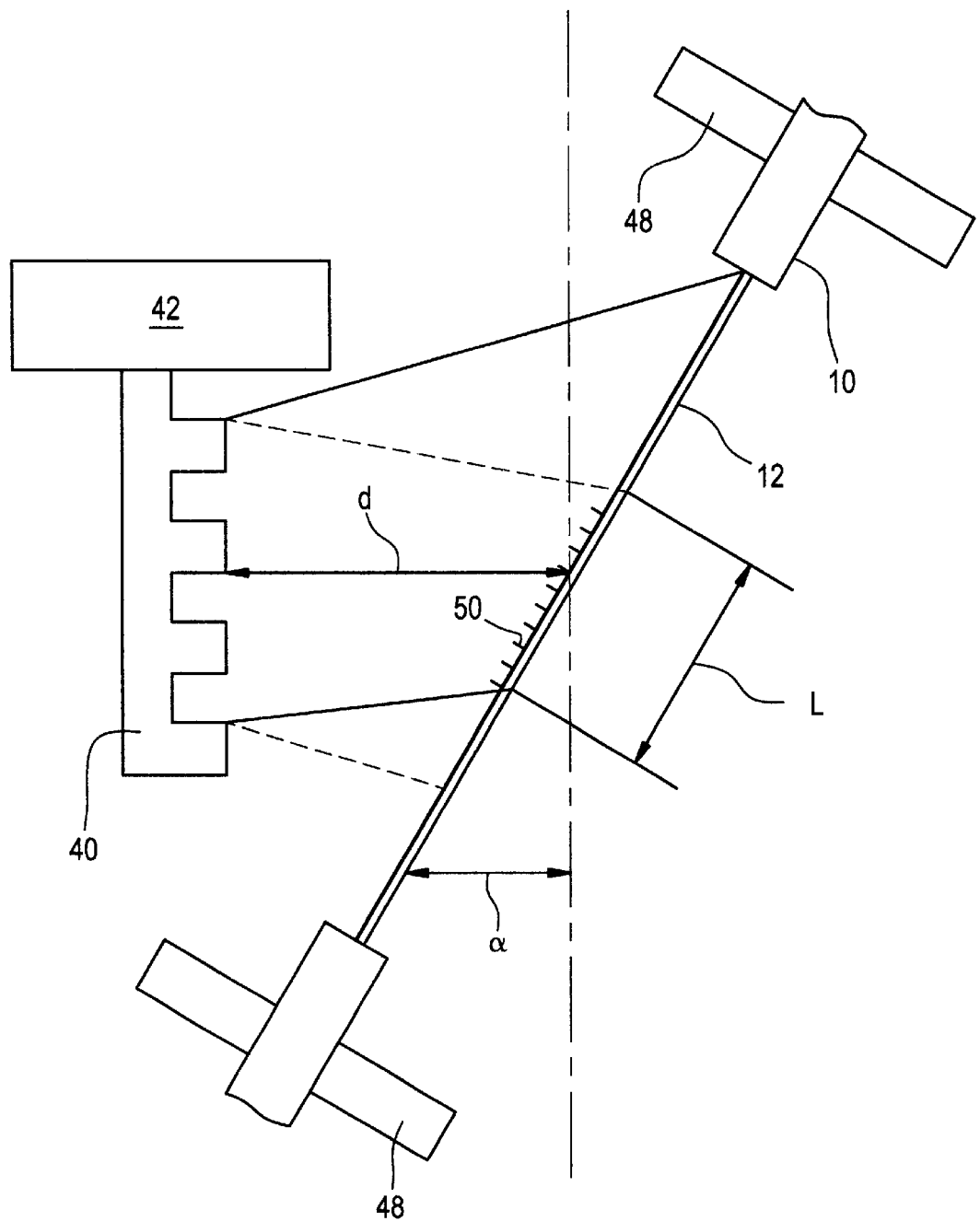
FIG. 2 is a diagram of the waveguide inclined with respect to the phase mask for producing a grating with a linearly chirped period.

Tilting the waveguide 10 in a plane that includes the "X" and "Z" coordinate directions as shown in FIG. 2 can be used to provide the grating 50 with a progressive linear chirp in accordance with the following equation:

$$\text{chirp} = \delta(\Delta\lambda_B)/L = (n_{eff}\lambda_{write}/z)\cot\theta\sin\alpha$$

where "$\delta(\Delta\lambda_B)$" is the amount of change in the center wavelength along a length "L" of the grating 50 and "$\alpha$" is the angle through which the waveguide 10 is tilted with respect to the phase mask 40. Chirp otherwise introduced by a chirped phase mask can be further increased, decreased, or even removed by similarly tilting the waveguide 10 in the "X-Z" plane. The waveguide 10 can also be rotated in the "X-Y" plane about the "Z" axis to write blazed gratings.

Control over convergence in the "Y" coordinate direction can also be used to regulate the intensity profile along the inclined axis 39 of the waveguide 10. Regardless of inclination, the intensity profile along the waveguide axis 39 can also be further controlled by an amplitude mask, which is preferably located between the spatial filter 30 and the phase mask 40. More than one spatial filter 30 can be arranged in series to further enhance the spatial coherence of the beam 18. Adding another spatial filter in series with the spatial filter 30 converts the $sinc^2$ intensity profile from the first spatial filter to a $sinc^4$ intensity profile from the second spatial filter.

One example that demonstrates some of the possibilities of this invention has the following values:

z=3.0 meters
d=1.0 centimeters
$\lambda_{write}$=248 nanometers
$n_{eff}$=1.45
$\theta$=13.4 degrees The resulting change in the Bragg wavelength "$\Delta\lambda_B$" equals 5.05 nanometers. Small changes in the Bragg wavelength can be used for such purposes as tuning to compensate for manufacturing variations or anticipated environmental effects. Large changes can be used to manufacture different gratings in the same or different waveguides using the same phase mask. For example, multiple gratings can be overwritten on the same waveguide with different Bragg wavelengths to support a plurality of functions such as compound optical sensors. A series of different gratings can also be produced along the waveguide to provide such functions as compound filtering or demultiplexing.

Figure 3:
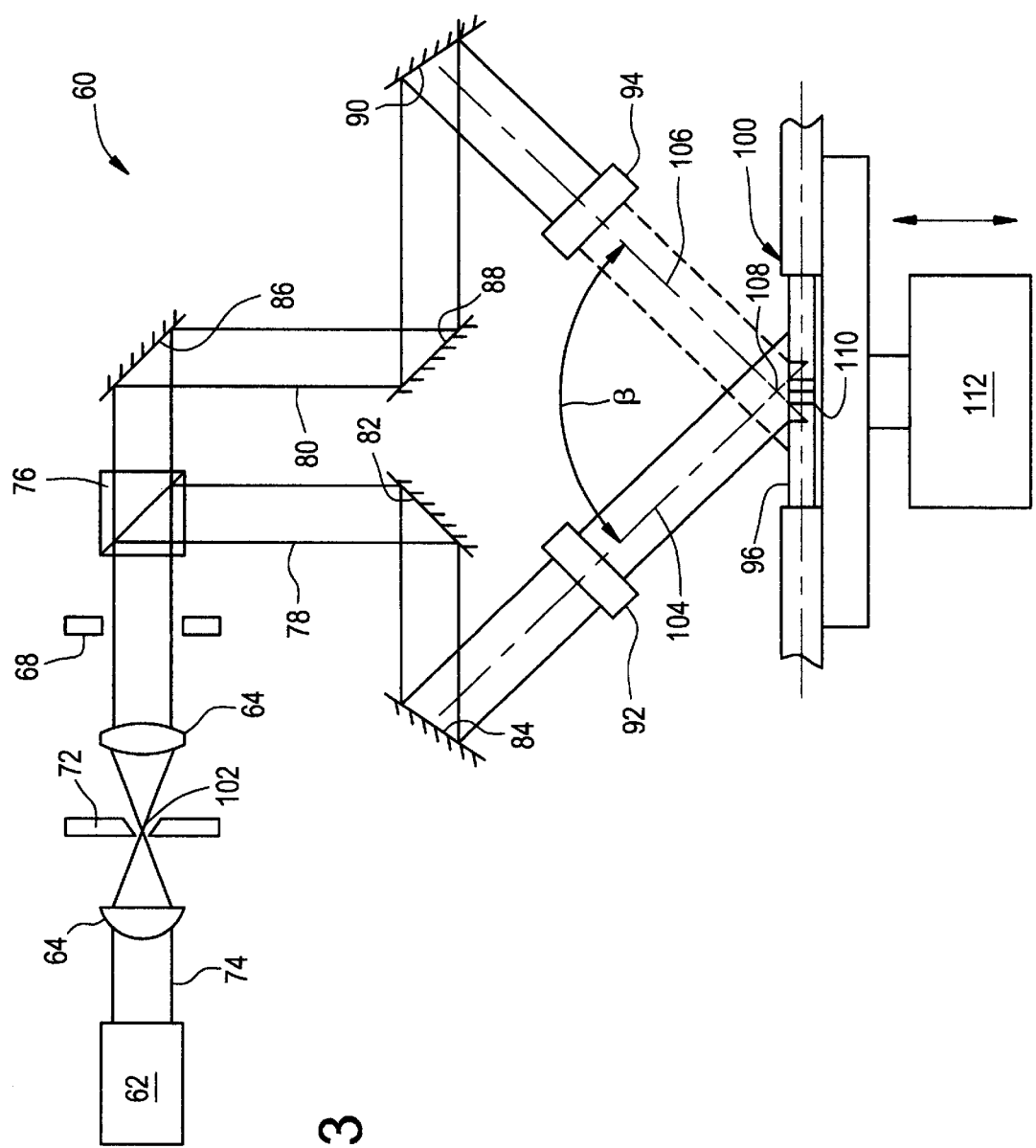
FIG. 3 is a diagram of an interferometer for photo-inducing a grating in a waveguide.
Figure 4:
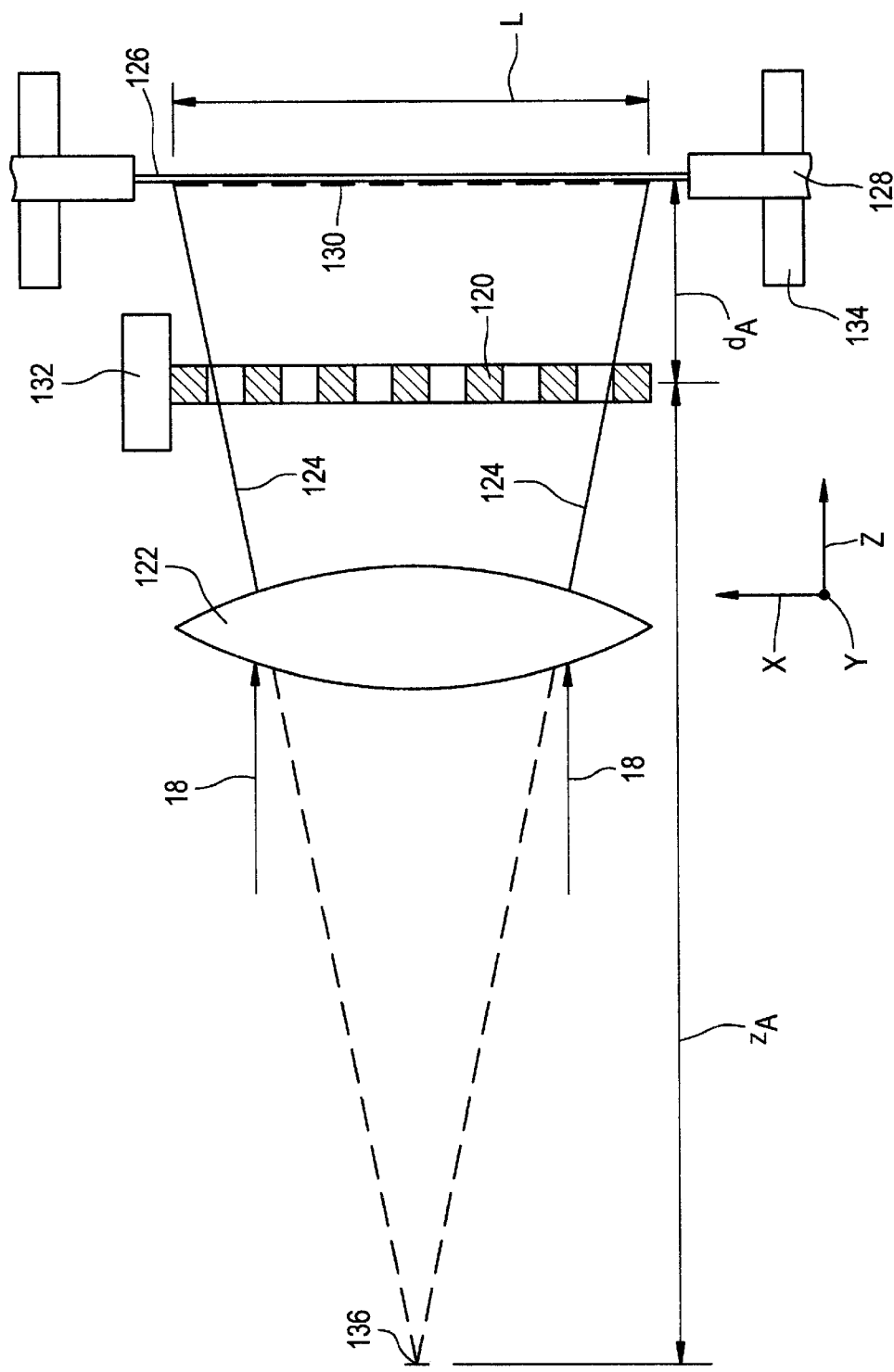
FIG. 4 is a diagram of an amplitude mask arranged together with a waveguide for photo-inducing a long period grating in the waveguide.

Although the invention is primarily applicable to the use of phase masks for producing optical gratings in waveguides, some overlapping benefits can be obtained when using interferometers for producing similar gratings. FIG. 3 depicts such an interferometer 60. A similar light source 62 is used along with a similar combination of focusing optics 64 and 66, an aperture stop 68, and a spatial filter 72 to fashion a spatially coherent beam 74 with a desired shape and intensity profile.

In contrast to the preceding embodiment, however, a beamsplitter block 76 divides the beam 74 into two separate beams 78 and 80 that are angularly oriented through angle "$\beta$" by combinations of respective turning mirrors 82, 84 and 86, 88, 90. Each beam 78 and 80 is finally shaped by a focusing optic 92 and 94 prior to impinging on an exposed portion 96 of a waveguide 100.

Similar to the preceding embodiment, the beams are shaped differently in a plane (i.e., the drawing plane of FIG. 3) within which the exposed portion 96 of the waveguide 100 is aligned with respect to a normal plane transverse to the waveguide 100. Within the plane of the waveguide 100, the beams 78 and 80 progressively converge upon the waveguide 100. (The same beams 78 and 80 could also be arranged to diverge upon the waveguide 100 similar to the preceding embodiment.) In the transverse plane, which includes a focal line 102 at the spatial filter 72, the beams 78 and 80 also preferably converge to concentrate more light energy on the waveguide 100.

The beams 78 and 80 have central axes 104 and 106 that cross in a position offset from the waveguide 100. A distance from a focus (e.g., 102) of the beams 78 and 80 in the waveguide plane to a crossing point 108 of the beam axes 104 and 106 is comparable to the distance "z" in the preceding embodiment. A distance from the crossing point 108 to the waveguide 100 is comparable to the distance "d" of the preceding embodiment. The distance "d" in this embodiment, however, can have a negative or positive value depending whether the waveguide 100 is located before or after the crossing point 108. The angle "$\beta$" corresponds to twice the angle "$\theta$" of the preceding embodiment.

The distances "z" and "d" can be adjusted to further regulate the average period of the resulting grating 110 formed in the waveguide 100 as well as issues of chirp and apodization. A waveguide mount 112 adjusts the distance "d" and can also be used to tilt the waveguide 100 to vary grating pitch in a more linear fashion. Since grating period can be adjusted by varying the angle "$\beta$", the distances "z" and "d" are expected to be more useful contributing to issues of chirp or apodization.

Our invention is also applicable to the manufacture of long period gratings. A setup similar to FIG. 1 can be used. However, the phase mask 40 is replaced by a rectangular amplitude mask 120. An additional focusing optic 122 is located between the spatial filter 40 and the amplitude mask to change the rate of divergence at which the beam 18 approaches the amplitude mask 120. Such focusing optics 122 can be used in any of the embodiments to move the effective center of curvature of the impinging beam 18 and to correspondingly shorten or lengthen the distance "z".

In contrast to the earlier embodiments that rely on the mechanism of interference to produce a pattern of light bands along waveguides 10 and 100, a single beam 124 emerges from the amplitude mask 120 containing a varying intensity pattern that produces the desired bands of light on an exposed portion 126 of a waveguide 128. Both a length "L" and a pitch spacing of a resulting long period grating 130 are controlled by the rate of divergence through the amplitude mask 120 (measured by the distance "$z_A$" from an effective center of curvature 136) and a distance "$d_A$" between the amplitude mask 120 and the exposed portion 126 of the waveguide 128.

A mask mount 132 is translatable in the "Z" coordinate direction to vary the distances "$z_A$" and "$d_A$", and a waveguide mount 134 is translatable in the same direction to vary the distance "$d_A$" independently of the distance "$z_A$". The waveguide mount is also tiltable about the "Y" or "Z" coordinate directions to further influence the chirp or blaze of the long period grating 130.

Other applications, uses, and arrangements of the invention will be apparent to those of skill in the art. The gratings produced according to our invention are particularly useful for communications systems but also include uses as sensors, dispersion compensators, and laser pump stabilizers.

We claim:

1. Apparatus for making photo-induced gratings comprising:
   a spatial filter that removes spatially incoherent light from a beam of light;
   a phase mask that divides the filtered beam of light provided by said spatial filter into two interfering beams that form an interference pattern with an average fringe period along a waveguide;
   a focusing system that directs the beam of light approaching said spatial filter as a converging beam and that further directs the filtered beam of light as another non-collimated beam impinging upon said phase mask; and
   a waveguide support that positions the waveguide at a distance from said phase mask to adjust the average fringe period of the interference pattern formed along the waveguide.

2. The apparatus of claim 1 in which said spatial filter filters incoherent light from a first of two orthogonal directions transverse to an axis of beam propagation.

3. The apparatus of claim 2, wherein said waveguide has a propagation axis and said waveguide support orients the waveguide along the first orthogonal direction.

4. The apparatus of claim 3 in which said focusing system converges the beam of light in the first orthogonal direction through a first focal line located at said spatial filter.

5. The apparatus of claim 4 in which said focusing system diverges the filter beam of light in the first orthogonal direction from the first focal line to said phase mask.

6. The apparatus of claim 5 in which the diverging beam of light impinging upon the phase mask has a center of curvature at said first focal line.

7. The apparatus of claim 6 in which said focusing system includes a first optical element that converges the beam of light in the first orthogonal direction through the first focal line and a second optical element that converges the filtered beam of light in a second of the orthogonal directions through a second focal line located along the waveguide.

8. The apparatus of claim 6 in which said first and second focal lines are angularly related in a common plane transverse to the axis of beam propagation.

9. The apparatus of claim 1 in which the distance between the phase mask and the waveguide support is adjustable along an axis of beam propagation for changing the average fringe period of the interference pattern formed along the waveguide.

10. The apparatus of claim 9 in which said waveguide support is tiltable about an axis transverse to the axis of beam propagation for varying the fringe period of the interference pattern along an axis of the waveguide as a function of a changing distance between said phase mask and said waveguide support.

11. The apparatus of claim 10 further comprising a phase mask support for translating said phase mask for adjusting an amount of change of the average fringe period associated with given distances between said phase mask and the waveguide.

12. A method of writing a photo-induced grating in a waveguide having an axis, said method comprising the steps of:
   spatially filtering a beam of light and improving spatial coherency of the beam;
   impinging the filtered beam of light upon a phase mask at angles of incidence that vary as a function of distance from a center of the beam; and
   positioning a photosensitive waveguide at a distance from the phase mask for writing a grating in the waveguide having an average period that is affected by the distance of the waveguide from the phase mask.

13. The method of claim 12 including a step of adjusting a rate at which the angles of incidence vary across the phase mask for changing the average period of the grating.

14. The method of claim 13 including the further step of determining both a desired average period of the grating and a desired length of the grating and relating said steps of adjusting the rate at which the angles of incidence vary across the phase mask and positioning the waveguide at a distance from the phase mask for meeting the desired period and length of grating, wherein said filtered beam does not move relative to the waveguide along said axis of said waveguide.

15. The method of claim 12 in which said step of spatially filtering includes filtering spatially incoherent light in a first of two orthogonal directions that extend transverse to an axis of the light beam along the direction of propagation.

16. The method of claim 15 in which the filtered beam is focused in the first orthogonal direction to control a rate at which the angles of incidence upon the phase mask vary as a function of distance from a center of the beam.

17. The method of claim 16 in which the filtered beam is differently focused in a second of the two orthogonal directions to concentrate light energy of the filtered beam on the waveguide.

18. The method of claim 17 in which said filtered beam approaches said phase mask as a diverging beam in the first orthogonal direction and as a converging beam in the second orthogonal direction.

19. The method of claim 12 including the further steps of spacing the phase mask from a focus of the filtered beam through a first distance "z", spacing the waveguide from the phase mask through a second distance "d", and adjusting the first distance "z" to change a magnitude of effect of the second distance "d" on the average period of the grating.

20. The method of claim 19 in which the grating is a Bragg grating and the first and second distances "z" and "d" are adjusted to vary a Bragg wavelength of the grating.

21. The method of claim 20 in which an amount of change in the Bragg wavelength is proportional to a quotient of the second distance "d" divided by the first distance "z".

22. The method of claim 21 in which the change in Bragg wavelength is approximately equal to the following expression:

$$n_{eff}\lambda_{write}(d/z)\cot\theta$$

where "$\lambda_{write}$" is the wavelength of the beam, "$n_{eff}$" is the effective average index of the waveguide, and "$\theta$" is the half angle between interfering beams that emerge from the phase mask for writing the grating.

23. The method of claim 12 including the further step of relatively tilting the waveguide with respect to the phase mask in a direction that varies the spacing between the phase mask and the waveguide for progressively varying the grating period as a function of the spacing.

24. A method of making compound optical gratings in a waveguide comprising the steps of:

spatially filtering a beam of light for improving spatial coherency of the beam;

focusing the filtered beam for progressively varying a width of the beam in a first direction transverse to an axis of beam propagation;

impinging the filtered and focused beam on a phase mask that divides the beam into two interfering beams;

positioning a photosensitive waveguide at a first distance from the phase mask for writing a first grating onto the waveguide having a first average period;

positioning the photosensitive waveguide at a second distance from the phase mask for writing a second grating onto the waveguide having a second average period; and controlling the progressive variation in the width of the beam impinging on the phase mask to affect an amount of difference between the first and second average periods of the first and second gratings.

25. The method of claim 24 in which said steps of positioning include relatively adjusting the waveguide with respect to the phase mask between the first and second distances.

26. The method of claim 24 in which said step of controlling includes adjusting a distance between a focus of the beam impinging on the phase mask and the phase mask.

27. The method of claim 26 including the further step of locating the focus at a spatial filter.

28. The method of claim 24 in which said step of focusing includes focusing the filtered beam in a second direction transverse to the axis of beam propagation.

29. The method of claim 28 in which the beam width is varied in the first direction at a different rate than the beam width is varied in the second direction.

30. The method of claim 24 in which the first and second gratings occupy overlapping portions of the waveguide.

31. An interferometer for forming an optical grating in a photosensitive waveguide comprising:

a source for producing a beam of actinic radiation;

a spatial filter that extends spatial coherence of the beam;

a beamsplitter that divides the beam into two interfering beams having respective central axes;

a focusing system that arranges both of the interfering beams as non-collimated beams;

an alignment system that angularly relates the two interfering beams so that their respective axes intersect at a crossing point; and a waveguide support that positions a waveguide in a position offset from the crossing point.

* * * * *